United States Patent
Takeuchi et al.

(10) Patent No.: US 7,830,944 B2
(45) Date of Patent: Nov. 9, 2010

(54) SURFACE-EMITTING LASER AND OPTICAL APPARATUS FORMED BY USING SURFACE-EMITTING LASER

(75) Inventors: Tetsuya Takeuchi, Yokohama (JP); Takeshi Uchida, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 7 days.

(21) Appl. No.: 12/275,389

(22) Filed: Nov. 21, 2008

(65) Prior Publication Data

US 2009/0135876 A1    May 28, 2009

(30) Foreign Application Priority Data

Nov. 27, 2007   (JP) .............. 2007-305862

(51) Int. Cl.
    *H01S 3/08*  (2006.01)
(52) U.S. Cl. ............... 372/99; 372/50.11; 372/50.124; 372/92; 372/96; 359/213.1; 359/359
(58) Field of Classification Search ............. 372/50.11, 372/92, 99, 50.124, 98; 359/213.1, 359
    See application file for complete search history.

(56) References Cited

U.S. PATENT DOCUMENTS

| | | | | |
|---|---|---|---|---|
| 4,710,779 A | * | 12/1987 | Funaki et al. ............... | 347/247 |
| 5,363,398 A | * | 11/1994 | Glass et al. ................... | 372/92 |
| 5,568,499 A | * | 10/1996 | Lear ......................... | 372/45.01 |
| 6,810,067 B2 | * | 10/2004 | Masood et al. .............. | 372/102 |
| 2007/0201527 A1 | | 8/2007 | Hori et al. ............... | 372/50.124 |
| 2008/0031297 A1 | | 2/2008 | Uchida .................... | 372/45.01 |
| 2008/0056320 A1 | | 3/2008 | Takeuchi ................. | 372/45.01 |
| 2008/0304532 A1 | | 12/2008 | Uchida ................... | 372/50.124 |

OTHER PUBLICATIONS

Unold, H.J., et al., "Improving Single-Mode VCSEL Performance by Introducing a Long Monolithic Cavity", IEEE Photonics Technology Letters, vol. 12, No. 8, Aug. 2000, pp. 939-941.

* cited by examiner

*Primary Examiner*—Minsun Harvey
*Assistant Examiner*—Yuanda Zhang
(74) *Attorney, Agent, or Firm*—Fitzpatrick, Cella, Harper & Scinto

(57) ABSTRACT

A surface-emitting laser has an active layer between a first distributed Bragg reflector and a second distributed Bragg reflector. The first distributed Bragg reflector is formed so as to have a resonant mode and a first longitudinal mode different from the resonant mode included in the reflectivity stop band and a second longitudinal mode different from the resonant mode and the first longitudinal mode excluded from the reflectivity stop band. Oscillation is suppressed in the first longitudinal mode and in the second longitudinal mode. As a result, the surface-emitting laser can oscillate in a single longitudinal mode, suppressing longitudinal mode hopping.

8 Claims, 8 Drawing Sheets

SURFACE-EMITTING LASER AND OPTICAL APPARATUS FORMED BY USING SURFACE-EMITTING LASER

BACKGROUND OF THE INVENTION

1. Field of the Invention

This invention relates to a surface-emitting laser and an optical apparatus formed by using a surface-emitting laser.

2. Description of the Related Art

A two-dimensional array of vertical cavity surface-emitting lasers (VCSELs) can be formed with ease. Then, light can be taken out from each of them in a direction perpendicular to the surface of the semiconductor substrate thereof.

Thus, a plurality of beams of light emitted from such a two-dimensional array can be utilized for parallel processing for the purpose of densification and high speed operations. Therefore, surface-emitting lasers are expected to find various industrial applications.

For example, a high density and high speed printing process can be realized by means of a plurality of beams for an electrophotographic printer when a surface-emitting laser array is employed as exposure light source for the electrophotographic printer.

However, the surface-emitting lasers are required to operate stably in a single transverse mode or in a single longitudinal mode because microspots of laser beam need to be formed stably on a photosensitive drum in the printing process of an electrophotographic printer.

Generally, a surface-emitting laser has a cavity length of several micrometers, which is very short if compared with the cavity length of an edge-emitting laser.

Therefore, the mirror loss of a surface-emitting laser needs to be minimized for laser oscillations. For this reason, a reflector illustrating a high reflectivity (not less than 99%) is employed.

To achieve such a high reflectivity, a distributed Bragg reflector (DBR) formed by alternately laying layers of two different types having different refractive indexes and an optical thickness of $\lambda/4$ ($\lambda$: oscillation wavelength) is normally employed.

Semiconductor materials that facilitate forming a distributed Bragg reflector and allow current injection are popularly being used for such reflectors.

Additionally, in recent years, there have been proposed techniques of forming a current-confining structure typically by arranging an AlGaAs layer showing an Al composition ratio of 98% in a distributed Bragg reflector and selectively oxidizing it in a hot steam atmosphere and thereby injecting an electric current only into the necessary region.

However, selective oxidation is not desirable from the viewpoint of single transverse mode because it gives rise to higher-order transverse modes as an unnecessarily large difference of refractive index is produced due to the existence of an oxidation layer.

As a countermeasure, a technique of reducing the diameter of the light-emitting region to about 3 μm has been employed so that higher-order transverse modes may not be confined and a single transverse mode oscillation may be realized.

However, the use of such a technique entails a remarkable reduction of the output of each device because of the reduced size of the light-emitting region.

Therefore, techniques of allowing a surface-emitting laser to operate in a single transverse mode, while maintaining a relatively large light-emitting region, by intentionally introducing a loss difference between a fundamental transverse mode and higher-order transverse modes have been discussed.

Photonics Technology Letters, August 2000, Volume: 12, Issue: 8, P939-941; Unold, H. J et al. describes the use of a surface-emitting laser having a long cavity length as a technique of producing a loss difference between a fundamental transverse mode and higher-order transverse modes.

A one-wave cavity that is popularly employed in surface-emitting lasers has an effective cavity length of about 1 to 2 μm. On the other hand, a 2 to 8 μm thick spacer layer is inserted into a surface-emitting laser described in the above-cited document in order to increase the cavity length. As a result, the diffraction loss is increased in higher-order transverse modes and single transverse mode oscillation can be realized with a large light-emitting area (of about 8 μm).

SUMMARY OF THE INVENTION

As described above, a surface-emitting laser as described in Photonics Technology Letters, August 2000, Volume: 12, Issue: 8, P939-941; Unold, H. J et al. can realize a single transverse mode oscillation with a large light-emitting area (of about 8 μm).

However, the inventors of the present invention found that the use of a long cavity length is accompanied by the following disadvantage.

Namely, there arises a problem of multi-longitudinal mode oscillation or that of longitudinal mode hopping, which is insignificant in conventional surface-emitting lasers.

A single longitudinal mode operation can be realized with a one-wavelength cavity that is normally employed in surface-emitting lasers having a short cavity length because the longitudinal mode intervals are large and not less than 50 nm.

On the other hand, the inventors of the present invention found that the longitudinal mode interval is reduced to about 10 nm when a spacer layer of 2 to 10 μm is inserted into the cavity in order to increase the cavity length. Therefore, as the quantity of the injected electric current is increased to achieve a desired light output level, the peak of gain is shifted to the long wavelength side to give rise to a longitudinal mode hopping phenomenon that a longitudinal mode hops to the next longitudinal mode at the long wavelength side.

FIG. 2 of the accompanying drawings is a graph illustrating a surface-emitting laser that gave rise to a longitudinal mode hopping phenomenon obtained in the course of the studies made by the inventors of the present invention. A 2 μm-thick spacer layer is inserted into a cavity in the illustrated instance.

Referring to FIG. 2, the surface-emitting laser oscillates with a desired resonance wavelength in a region where the quantity of the injected electric current is small and not greater than 3 mA. However, it will be seen that the longitudinal mode hops to the next resonant mode (at 685 nm) as the injected electric current is raised above 4 mA in order to increase the light output.

As a longitudinal mode hops in this way, there arises a problem that both the light emission intensity and the far field pattern become instable. This is a phenomenon not desirable for light sources of electrophotographic exposure apparatus that are required to ensure a high beam spot stability.

In view of the above-identified problems, it is therefore an object of the present invention to provide a surface-emitting laser that can suppress longitudinal mode hopping and oscillate in a single longitudinal mode.

Another object of the present invention is to provide an optical apparatus that is formed by using a surface-emitting laser according to the present invention and can produce a stable beam spot.

Thus, a surface-emitting laser according to the present invention can oscillate in a single longitudinal mode, suppressing longitudinal mode hopping.

Additionally, an optical apparatus that produces a stable beam spot can be realized by using a surface-emitting laser according to the present invention.

Further features of the present invention will become apparent from the following description of exemplary embodiments with reference to the attached drawings.

DESCRIPTION OF THE PREFERRED EMBODIMENTS

Figure 1:
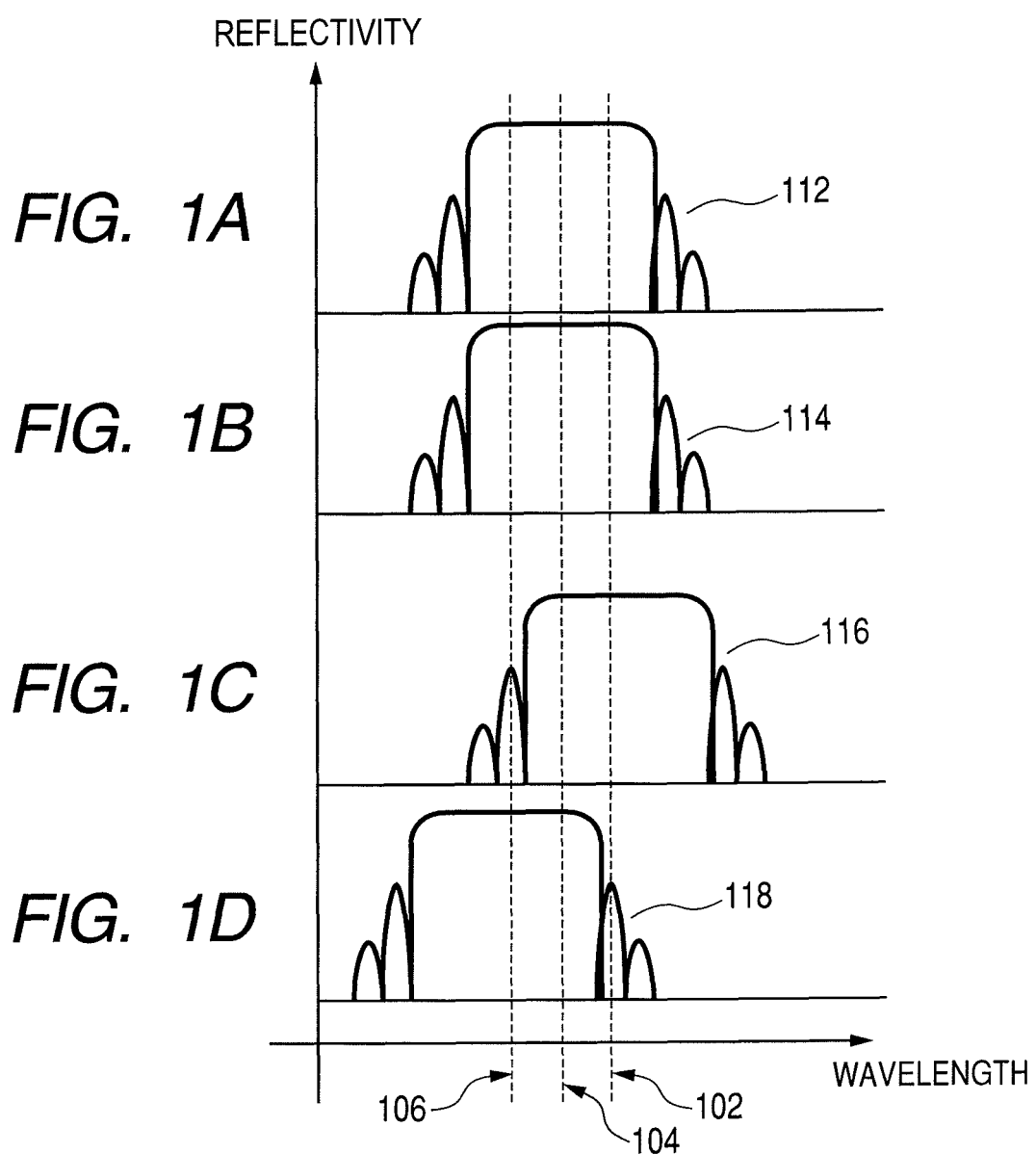
FIGS. 1A, 1B, 1C and 1D are graphs illustrating the reflection spectrums of the distributed Bragg reflectors according to an exemplary embodiment of the present invention in comparison with those of the distributed Bragg reflectors of a known surface-emitting laser.

Normally, a distributed Bragg reflector is so designed that the center wavelength of the reflectivity stop band thereof agrees with the wavelength in a resonant mode.

However, when a resonant mode and some other longitudinal modes are close to each other and the upper and lower distributed Bragg reflectors are designed according to the same design criteria, they exhibit a high reflectivity not only in a desired resonant mode but also in other longitudinal modes. Then, there arises a risk that they oscillate also in unintended longitudinal modes.

For this reason, according to the present invention, oscillation in any unintended longitudinal modes is suppressed by shifting the reflectivity stop band of a distributed Bragg reflector to the long wavelength side or the short wavelength side.

Now, the configuration of a surface-emitting laser according to the present invention will be described below.

A surface-emitting laser according to the present invention has an active layer between a first distributed Bragg reflector and a second distributed Bragg reflector. The first distributed Bragg reflector may be an upper reflector or a lower reflector. The second distributed Bragg reflector operates as a lower reflector when the first distributed Bragg reflector is an upper reflector. On the other hand, the second distributed Bragg reflector operates as an upper reflector when the first distributed Bragg reflector is a lower reflector.

The first distributed Bragg reflector of a surface-emitting laser according to the present invention has a reflectivity stop band (which is also referred to as stop band), and a resonant mode and a first longitudinal mode that is different from the resonant mode are included in the reflectivity stop band. On the other hand, a second longitudinal mode that is different from both the resonant mode and the first longitudinal mode is excluded from the reflectivity stop band.

The first longitudinal mode may be a longitudinal mode at a shorter wavelength or at a longer wavelength relative to the resonant mode. The second longitudinal mode is a longitudinal mode at a longer wavelength relative to the resonant mode when the first longitudinal mode is a longitudinal at a shorter wavelength relative to the resonant mode. On the other hand, the second longitudinal mode is a longitudinal mode at a shorter wavelength relative to the resonant mode when the first longitudinal mode is a longitudinal mode at a longer wavelength relative to the resonant mode.

A reflectivity stop band is a region that shows a highreflectivity. The reflectivity of the stop band is sufficient when the surface-emitting laser can oscillate with it. For example, a reflectivity stop band typically shows a reflectivity of not less than 99%.

Now a specific embodiment of surface-emitting laser according to the present invention will be described below.

FIGS. 1A, 1B, 1C and 1D are graphs illustrating the reflection spectrums of the distributed Bragg reflectors according to an exemplary embodiment of the present invention in comparison with those of the distributed Bragg reflectors of a known surface-emitting laser in order to describe the configuration of a surface-emitting laser of this embodiment.

In FIGS. 1A through 1D, the horizontal axis indicates the wavelength and the vertical axis indicates the reflectivity. FIGS. 1A and 1B are graphs illustrating the distributed Bragg reflectors of a known surface-emitting laser.

In FIGS. 1A and 1B, both the upper distributed Bragg reflector and the lower distributed Bragg reflector are so designed that a desired resonant mode 104 is found at the center wavelength of the reflectivity stop band in the reflection spectrum 112 of the upper distributed Bragg reflector and also in the reflection spectrum 114 of the lower distributed Bragg reflector.

However, with such a design of the distributed Bragg reflectors, they illustrate a high reflectivity in a longitudinal mode 102 at the long wavelength side and in a longitudinal mode 106 at the short wavelength side as well as in the desired resonant mode 104 when the longitudinal mode interval is small. Then, as a result, the surface-emitting laser highly possibly oscillates in a longitudinal mode 102 at the long wavelength side and in a longitudinal mode 106 at the short wavelength side.

Specifically, conventional surface-emitting lasers are normally designed and prepared in a manner as described below.

Each of the upper distributed Bragg reflector and the lower distributed Bragg reflector is designed and prepared such that the resonance wavelength is found at the center of the reflectivity stop band thereof. More specifically, low refractive index layers and high refractive index layers having an optical thickness of λ/4, λ being the resonance wavelength, are laid one on the other as pairs until the necessary reflectivity is achieved.

The distributed Bragg reflector at the side of taking out light (e.g., the upper distributed Bragg reflector) is prepared to show a reflectivity lower than the reflectivity of the distributed Bragg reflector at the side of not taking out light (e.g., the lower distributed Bragg reflector). In other words, the number of layers (the number of pairs) is reduced for the former reflector to achieve an optimal light taking out efficiency.

However, as the distributed Bragg reflectors are designed in this way, the prepared surface-emitting laser can oscillate in the longitudinal mode 102 at the long wavelength side and in the longitudinal mode 106 at the short wavelength side to make it difficult to realize stable operations in a single longitudinal mode.

To the contrary, the center wavelength of the reflectivity stop band of the upper distributed Bragg reflector and that of the reflectivity stop band of the lower distributed Bragg reflector are differentiated in this embodiment.

For example, the lower distributed Bragg reflector is so designed that the resonant mode 104 and the longitudinal mode 106 at the short wavelength side are included in the reflectivity stop band of the lower distributed Bragg reflector as seen from the reflection spectrum 118 of the lower distributed Bragg reflector in FIG. 1D. The reflectivity in this stop band is, for example, not less than 99%. On the other hand, the longitudinal mode 102 at the long wavelength side is excluded from the reflectivity stop band.

Similarly, the upper distributed Bragg reflector is so designed that the resonant mode 104 and the longitudinal 102 at the long wavelength side are included in the reflectivity stop band of the upper distributed Bragg reflector as seen from the reflection spectrum 116 of the upper distributed Bragg reflector in FIG. 1C. The reflectivity in this stop band is, for example, not less than 99%. On the other hand, the longitudinal mode 106 at the short wavelength side is excluded from the reflectivity stop band.

As the distributed Bragg reflectors are designed in this way, the surface-emitting laser can oscillate only in the desired resonant mode 104 because it is found in the reflectivity stop band of the upper distributed Bragg reflector and that of the lower distributed Bragg reflector. On the other hand, the longitudinal mode 102 at the long wavelength side and the longitudinal mode 106 at the short wavelength side are excluded from the reflectivity stop bands of the distributed Bragg reflectors so that oscillation in these longitudinal modes is suppressed.

The reflectivity of the upper distributed Bragg reflector and that of the lower distributed Bragg reflector are both controlled by adjusting their respective center wavelengths of reflectivity stop bands to suppress any oscillation in the longitudinal modes in the above embodiment. However, an arrangement of suppressing oscillation in either one of the longitudinal modes by adjusting the center wavelengths of the reflectivity stop bands of the distributed Bragg reflectors but suppressing oscillation in the other longitudinal mode by inserting a light absorption layer is also possible.

For example, the lower distributed Bragg reflector is designed to show a reflection spectrum same as the reflection spectrum 118 while the upper distributed Bragg reflector is designed to show a reflection spectrum same as the reflection spectrum 112. Then, the distributed Bragg reflectors are made to show a large loss in the longitudinal mode 106 at the short wavelength side by means of a layer that absorbs light by band-to-band transition.

With the above-described arrangement, a single longitudinal mode operation can be realized because a large loss can be produced in longitudinal modes other than a desired resonant mode.

The loss in a longitudinal mode where no oscillation is intended needs to be made equal to not less than five times, preferably not less than ten times, of the loss in a desired resonant mode to achieve a stable operation in a longitudinal mode.

Now, embodiments of the present invention will be described.

First Embodiment (Overall Configuration)

The configuration of the first embodiment, which is a surface-emitting laser that operates in a resonant mode of 680 nm, will be described below.

Figure 3:
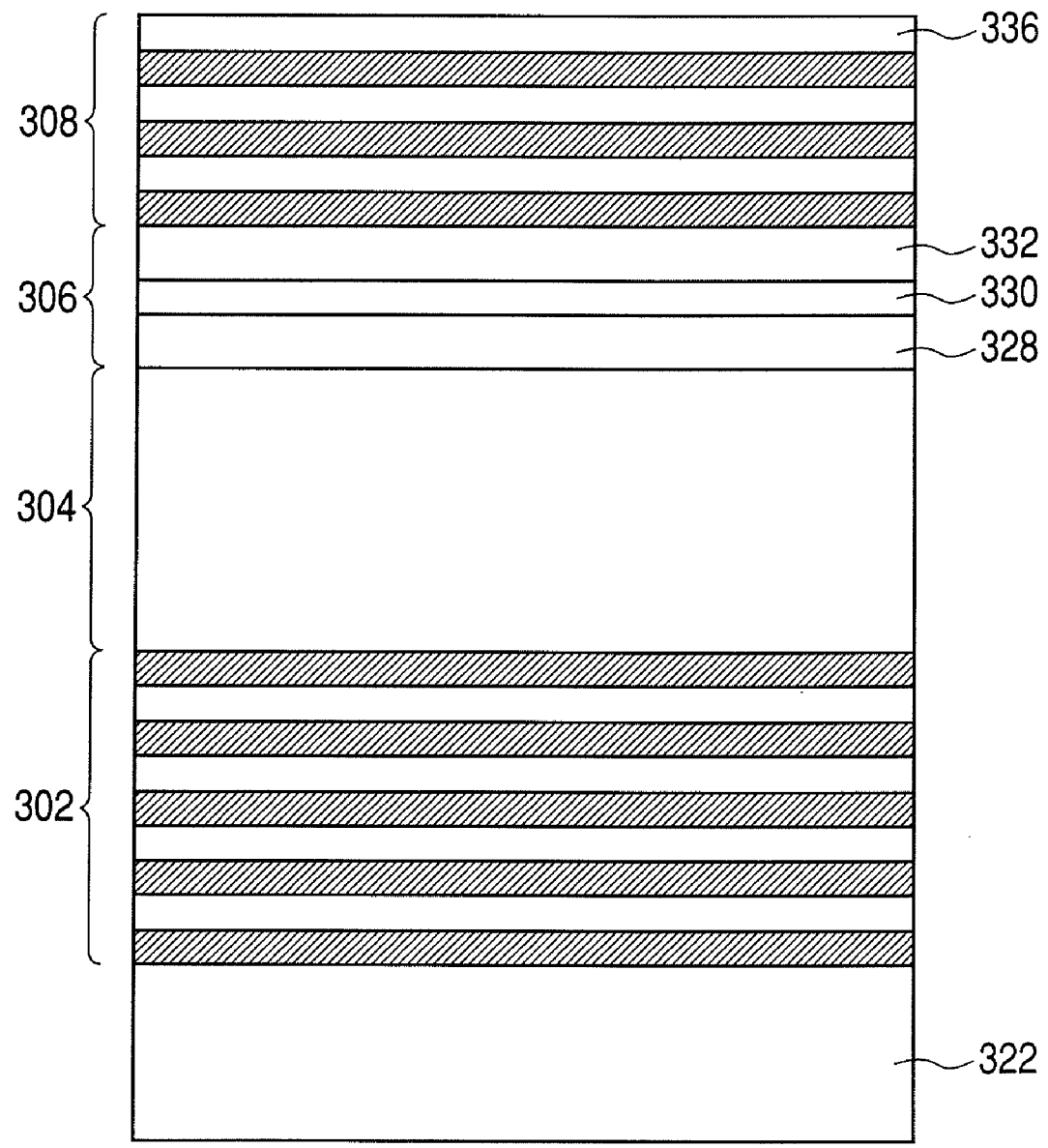
FIG. 3 is a schematic cross sectional view of the surface-emitting laser of a first embodiment, which is a red surface-emitting laser, illustrating the layer structure thereof.

FIG. 3 is a schematic cross sectional view of the first embodiment, which is a red surface-emitting laser, illustrating the layer structure thereof.

Referring to FIG. 3, the red surface-emitting laser has an n-type GaAs substrate 322, a lower distributed Bragg reflector 302, a first cavity section 304, a second cavity section 306 and an upper distributed Bragg reflector 308.

More specifically, the lower distributed Bragg reflector 302 is formed by laying films of n-type AlAS and those of n-type $Al_{0.5}Ga_{0.5}As$ to a predetermined thickness. Similarly, the upper distributed Bragg reflector 308 is formed by laying films of p-type $Al_{0.9}Ga_{0.1}As$ and those of p-type $Al_{0.5}Ga_{0.5}As$ to a predetermined thickness.

The first cavity section 304 is formed by using n-type $Al_{0.9}Ga_{0.1}As$. The second cavity section 306 is formed by an n-type $Al_{0.35}Ga_{0.15}In_{0.5}P$ spacer layer 328, a GaInP/$Al_{0.25}Ga_{0.25}In_{0.5}P$ multiple quantum well 330 and a p-type $Al_{0.35}Ga_{0.15}In_{0.5}P$ spacer layer 332. The uppermost layer of the upper distributed Bragg reflector 308 is a p-type GaAs contact layer 336.

The second cavity section 306 that is formed by a plurality of AlGaInP layers is designed to illustrate an optical thickness equal to 2 of the desired oscillation wavelength (680 nm in this instance). The actual overall thickness of the second cavity section will be about 0.4 μm. The film thickness of the n-type $Al_{0.35}Ga_{0.15}In_{0.5}P$ spacer layer 328 and that of the p-type $Al_{0.35}Ga_{0.15}In_{0.5}P$ spacer layer 332 are determined so as to arrange the GaInP/$Al_{0.25}Ga_{0.25}In_{0.5}P$ multiple quantum well 330 at the antinodes of the standing wave of internal light distribution.

The GaInP/$Al_{0.25}Ga_{0.25}In_{0.5}P$ multiple quantum well 330 typically includes four 6 nm-thick GaInP well layers and the wavelength at the peak of light emission of itself is set to 660 nm. A detuning (the difference between the resonance wavelength and the wavelength of light emission of the active layer) of 20 nm is provided for high output operations.

The first cavity section 304 that is formed by an n-type $Al_{0.9}Ga_{0.1}As$ layer is designed to illustrate an optical thickness of 20 times the desired oscillation wavelength (680 nm in this instance). The actual thickness of the first cavity section 304 will be about 4 μm.

A long cavity is realized by the first cavity section 304.

(Lower Distributed Bragg Reflector and Upper Distributed Bragg Reflector)

When $Al_{0.9}Ga_{0.1}As$ and $Al_{0.5}Ga_{0.5}As$ are used for the upper distributed Bragg reflector 308 at the side for taking out light in a surface-emitting laser that oscillates at 680 nm, the number of pairs of $Al_{0.9}Ga_{0.1}As$ and $Al_{0.5}Ga_{0.5}As$ is preferably about 40.

When AlAs and $Al_{0.5}Ga_{0.5}As$ are used for the lower distributed Bragg reflector 302 in such a surface-emitting laser, the number of pairs of AlAs and $Al_{0.5}Ga_{0.5}As$ is preferably about 60.

However, the number of pairs can be appropriately adjusted in order to obtain necessary characteristic.

An $Al_{0.98}Ga_{0.02}As$ layer that can operate as a selective oxidation layer can be arranged in the upper distributed Bragg reflector for efficient electric current injection.

Unlike ordinary distributed Bragg reflectors, the design criteria as listed below are applicable to the upper and lower distributed Bragg reflectors of this embodiment.
(1) The lower distributed Bragg reflector 302 is designed and prepared with a design wavelength (the center wavelength of the reflectivity stop band) equal to 696 nm that is longer than the resonance wavelength of 680 nm.
(2) The upper distributed Bragg reflector 308 is designed and prepared with a design wavelength equal to 672 nm that is shorter than the resonance wavelength of 680 nm.
(3) The number of pairs of the upper distributed Bragg reflector 308 is increased to make the reflectivity at 680 nm of a distributed Bragg reflector of this embodiment whose design wavelength is 672 nm subsequently equal to the reflectivity at 680 nm of the distributed Bragg reflector whose design wavelength is 680 nm. More specifically, while the number of pairs is 40 with a conventional method, it is increased to 45 for the purpose of this invention.

The intended effects of the present invention can appropriately be obtained by complying with the above described criteria (1), (2) and (3).

Figure 4:
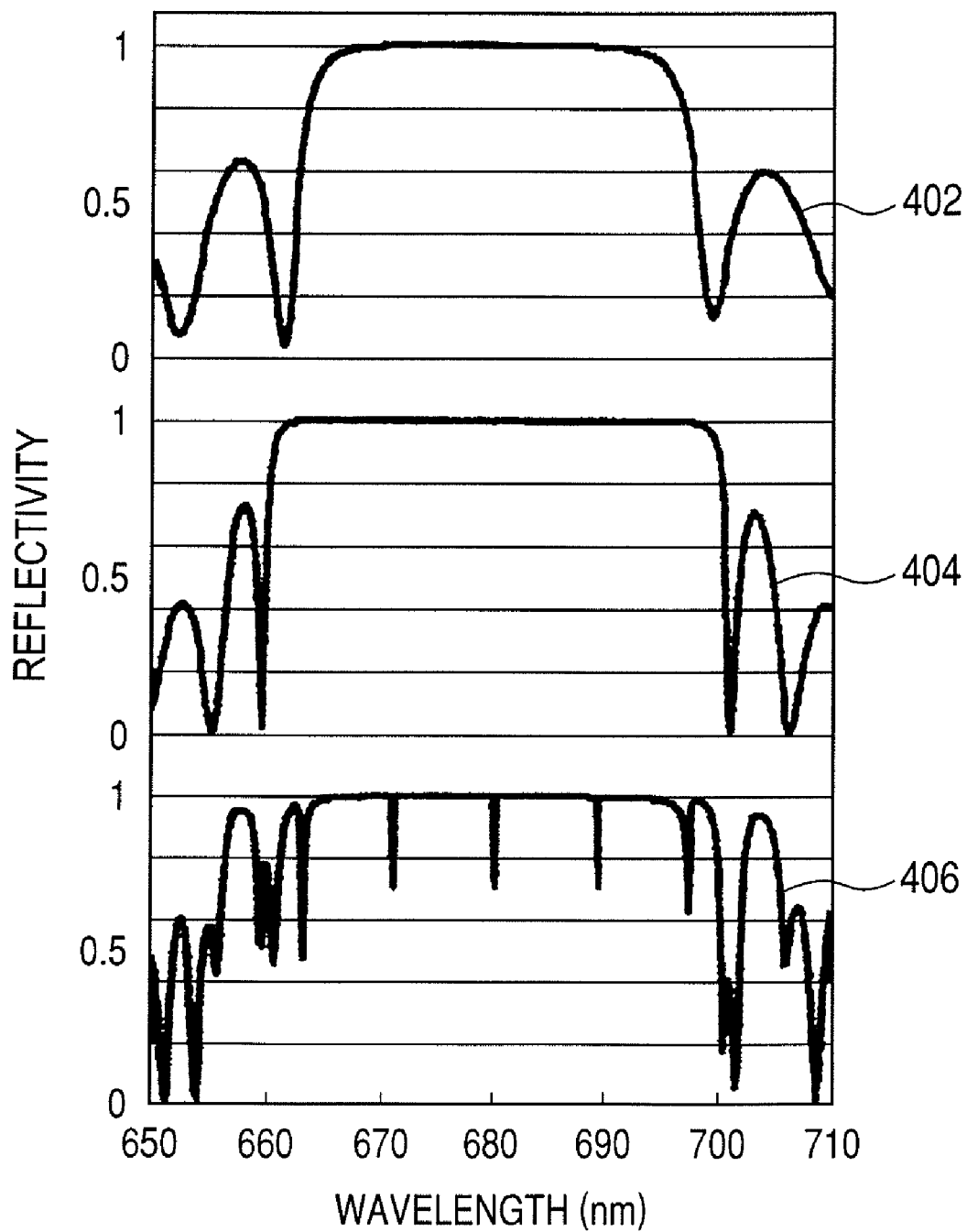
FIG. 4 is a schematic illustration of the reflection spectrum of the upper distributed Bragg reflector, that of the lower distributed Bragg reflector and that of the entire layer structure of a known surface-emitting laser.

FIG. 4 is a schematic illustration of the reflection spectrum 402 of the upper distributed Bragg reflector, the reflection spectrum 404 of the lower distributed Bragg reflector and the reflection spectrum 406 of the entire structure of the device that includes an active layer and a cavity section of a surface-emitting laser designed by means of a known technique.

A long cavity length is realized in this surface-emitting laser by inserting an about 4 μm-thick $Al_{0.5}Ga_{0.5}As$ layer so that the wavelength interval in a longitudinal mode is reduced to about 9 nm as seen from the reflection spectrum 406 of the entire structure of the device and included in the reflectivity stop bands (of about 35 nm) of the upper and lower distributed Bragg reflectors. Thus, as a result, the surface-emitting laser is likely to oscillate in three longitudinal modes as seen from the reflection spectrum 406 of the entire structure of the device.

Figure 2:
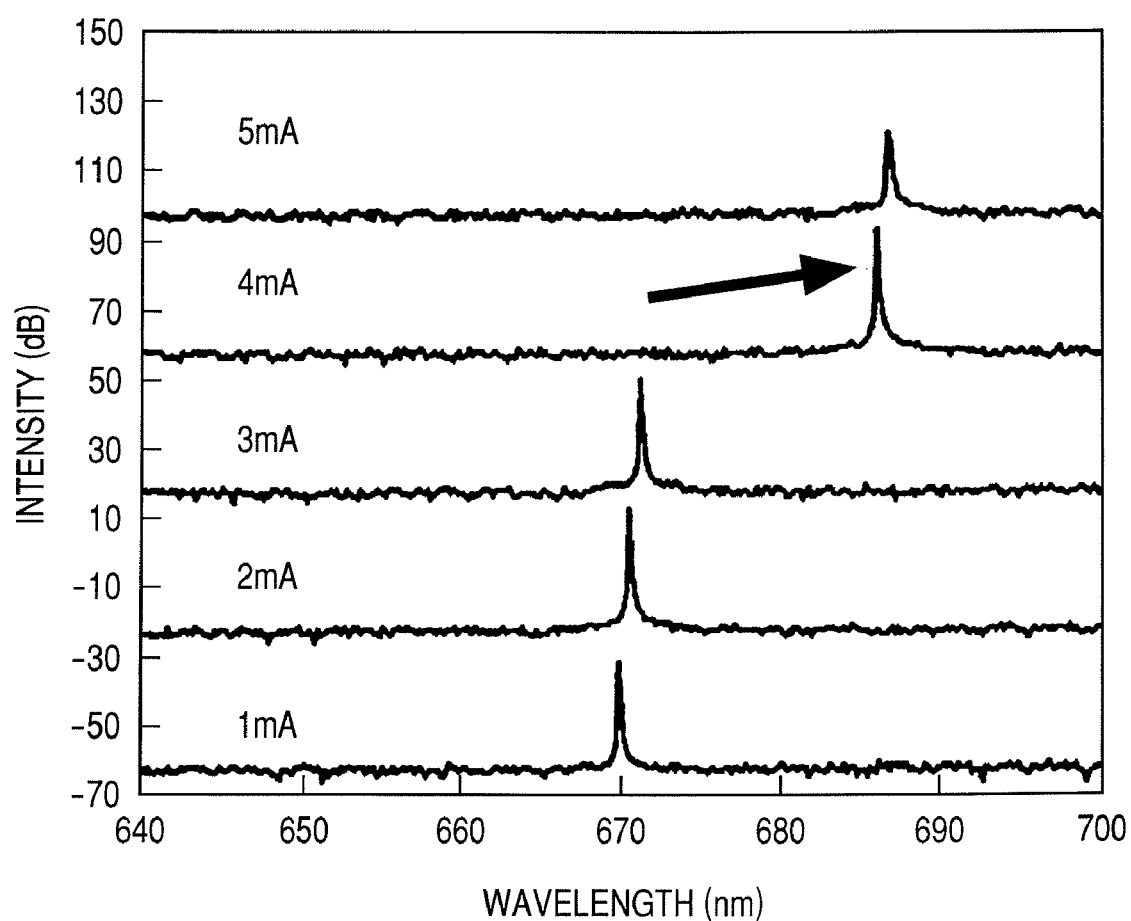
FIG. 2 is a graph illustrating longitudinal mode hopping of a surface-emitting laser that is a sort of multi-longitudinal mode oscillation.

Table 1 below illustrates the reflectivity and the mirror loss in a desired resonant mode and those in the longitudinal modes at neighboring wavelengths (of about 671 nm and 689 nm). Longitudinal mode hopping as shown in FIG. 2 is likely to take place since the reflectivity and mirror loss do not illustrate any significant difference in the three longitudinal modes.

TABLE 1

|  | n-DBR | | p-DBR | |
| --- | --- | --- | --- | --- |
| Wavelength (nm) | reflectivity | Mirror loss | reflectivity | Mirror loss |
| Desired resonance mode | 680 | 99.89% | 1.778 | 99.67% | 5.539 |
| Longitudinal mode at shorter | 671 | 99.88% | 2.048 | 99.34% | 11.11 |

TABLE 1-continued

|  | n-DBR | | p-DBR | |
| --- | --- | --- | --- | --- |
| Wavelength (nm) | reflectivity | Mirror loss | reflectivity | Mirror loss |
| wavelength | | | | |
| Longitudinal mode at longer wavelength | 689 | 99.87% | 2.230 | 99.21% | 13.22 |

Figure 5:
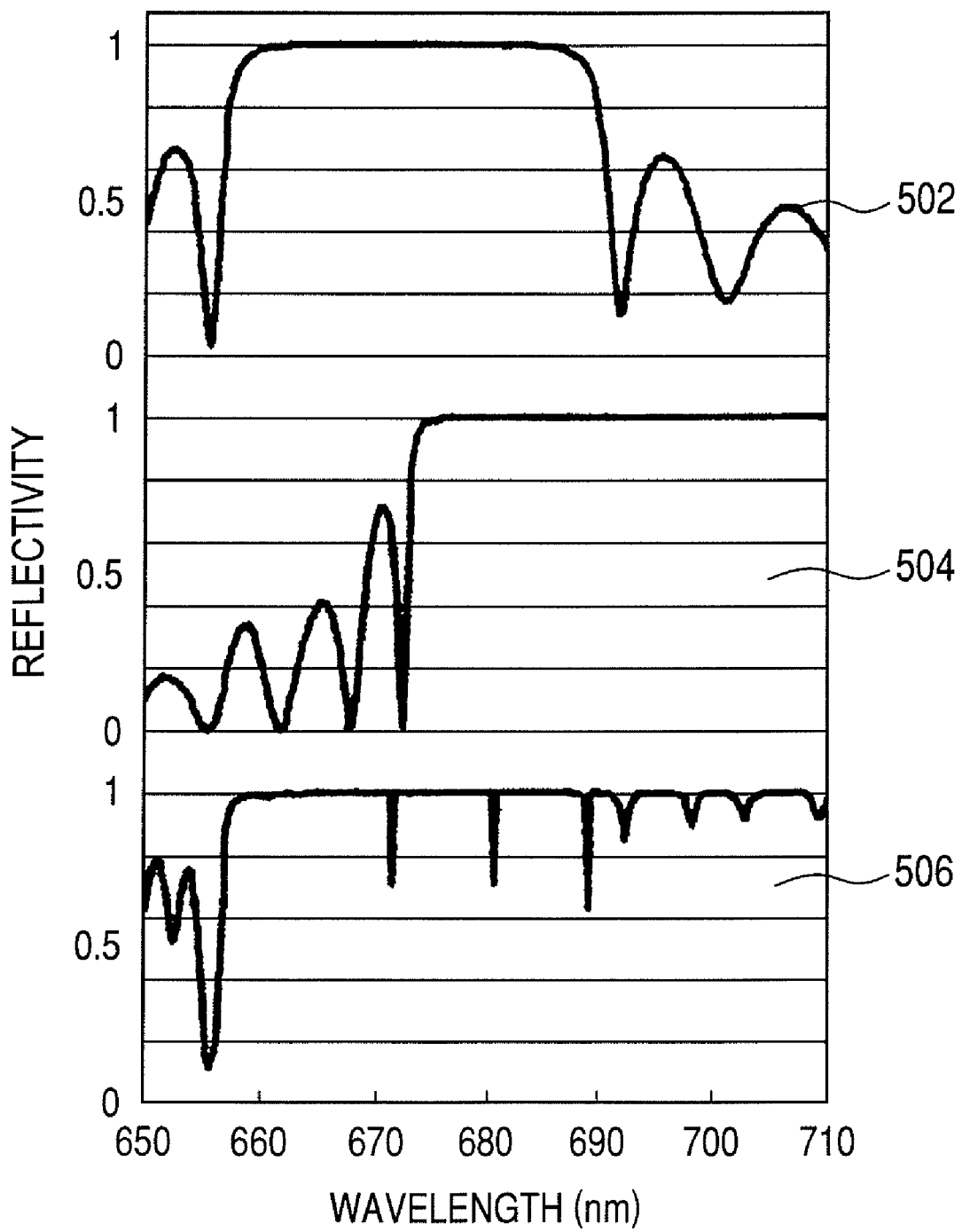
FIG. 5 is a schematic illustration of the reflection spectrum of the upper distributed Bragg reflector, that of the lower distributed Bragg reflector and that of the entire layer structure of the surface emitting laser of the first embodiment.

On the other hand, FIG. 5 is a schematic illustration of the reflection spectrum 502 of the upper distributed Bragg reflector, the reflection spectrum 504 of the lower distributed Bragg reflector and the reflection spectrum 506 of the entire structure of the device of a surface-emitting laser designed by means of the technique of this embodiment. As seen from the reflection spectrum 504 of the lower distributed Bragg reflector, the reflectivity stop band is shifted to the long wavelength side according to the aim of the design. Then, as a result, a reflectivity of not less than 99% is achieved in a desired resonant mode (at 680 nm). On the other hand, the reflectivity in the longitudinal mode that is found at the short wavelength side relative to the longitudinal mode (at shorter wavelengths than about 617 nm) is remarkably short of 99%.

Additionally, as seen from the reflection spectrum 502 of the upper distributed Bragg reflector, the reflectivity stop band is shifted to the short wavelength side according to the aim of the design. Then, as a result, the reflectivity in the longitudinal mode that is found at the long wavelength side relative to the resonant mode (at longer wavelengths than about 689 nm) is lower than 99%.

Table 2 below illustrates specific values of reflectivity and mirror loss of this embodiment.

TABLE 2

|  | n-DBR | | p-DBR | |
| --- | --- | --- | --- | --- |
| Wavelength (nm) | reflectivity | Mirror loss | reflectivity | Mirror loss |
| Desired resonance mode | 680 | 99.85% | 2.423 | 99.67% | 5.593 |
| Longitudinal mode at shorter wavelength | 671 | 70.40% | 585.0 | 99.77% | 3.769 |
| Longitudinal mode at longer wavelength | 689 | 99.86% | 2.308 | 90.27% | 170.6 |

As seen from Table 2, a longitudinal mode where a high reflectivity of not less than 99% is found only at 680 nm for both the upper and lower distributed Bragg reflectors and a large mirror loss occurs in the neighboring longitudinal modes at the short wavelength side and at the long wavelength side. Thus, as a result, a single longitudinal mode operation can be realized because the surface-emitting laser hardly oscillates in either of the longitudinal mode at the short wavelength side and the longitudinal mode at the long wavelength side.

Normally, when the center wavelength of the high reflectivity stop band of a distributed Bragg reflector is shifted, the resonance wavelength of the entire device is also shifted accordingly. However, a long cavity structure that is as long as 20 times of the wavelength is employed in this embodiment.

Therefore, the design wavelength of the structure is dominant and is not influenced by such a shift. In other words, a desired resonance wavelength can be achieved simply by appropriately designing the first cavity section 304 and the second cavity section 306.

An epitaxial wafer is formed according to the above described design criteria and the devices of a surface-emitting laser are formed by means of a known technique that involves photolithograpy, vapor deposition of insulating films and metal films and wet and dry etching processes to ultimately produce a complete surface-emitting laser.

Not only a single device but also an array where a plurality of devices are two-dimensionally arranged can be prepared by appropriately designing a mask for the array. Surface-emitting lasers provide an advantage that an array structure can be produced relatively easily simply by selectively using a mask.

A surface-emitting laser can be made to operate in a single longitudinal mode according to the present invention. Such a surface-emitting laser can find applications in apparatus that require beam spot stability.

Second Embodiment

The second embodiment differs from the above-described first embodiment in that it is provided with a light absorption layer.

Figure 6:
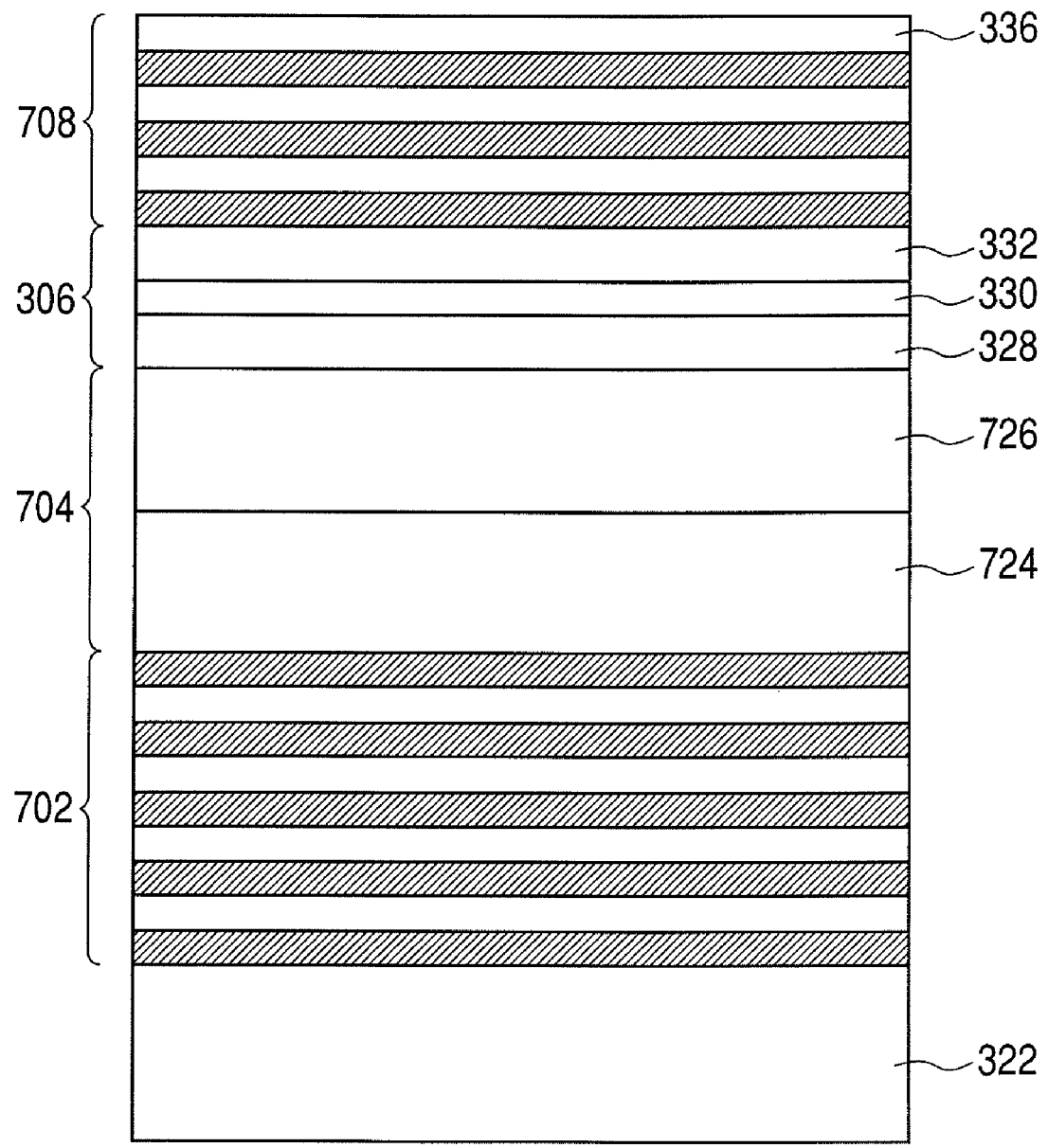
FIG. 6 is a schematic cross-sectional view of the surface-emitting laser of a second embodiment, which is a red surface-emitting laser, illustrating the layer structure thereof.

FIG. 6 is a schematic cross sectional view of the surface-emitting laser of the second embodiment, which is a red surface-emitting laser, illustrating the layer structure thereof.

The components of this embodiment same as those of the first embodiment illustrated in FIG. 3 are denoted respectively by the same reference symbols and will not be described here any further.

The difference between the surface-emitting laser of this embodiment and that (FIG. 3) of the first embodiment lies in the structure of the first cavity section 704.

Referring to FIG. 6, the first cavity section 704 of this embodiment is formed by two layers including a 2 μm-thick n-type $Al_{0.35}Ga_{0.65}As$ layer 724 and a 2 μm-thick n-type $Al_{0.9}Ga_{0.1}As$ layer 726. A layer that gives rise to absorption mainly on the basis of band-to-band transition in resonant modes (at 671 nm and at 662 nm) found at the short wavelength side relative to a desired resonance wavelength (of 680 nm in this instance) is introduced by appropriately controlling the Al composition ratio and the film thickness of these layers.

The Al composition ratio is appropriately selected so that the absorption may not affect the desired resonant mode.

In this embodiment, the above object is achieved by using AlGaAs for the absorption layer with the Al composition ratio of 0.35.

Now, the lower distributed Bragg reflector 702 and the upper distributed Bragg reflector 708 of this embodiment will be described below. The design criteria of the upper and lower distributed Bragg reflectors of this embodiment are listed below.

(1) The lower distributed Bragg reflector 702 is designed and prepared with a design wavelength equal to 664 nm that is shorter than the resonance wavelength of 680 nm. More specifically n-type AlAs layers and $Al_{0.5}Ga_{0.5}As$ layers are laid one on the other.

(2) The design wavelength of the upper distributed Bragg reflector 708 is defined to be 680 nm which is equal to the resonance wavelength. More specifically, p-type $Al_{0.9}Ga_{0.1}As$ layers and p-type $Al_{0.5}Ga_{0.5}As$ layers are laid one on the other. The number of pairs is 40 as determined by a conventional technique.

The intended effects of the present invention can appropriately be obtained by complying with the above described criteria (1) and (2).

Figure 7:
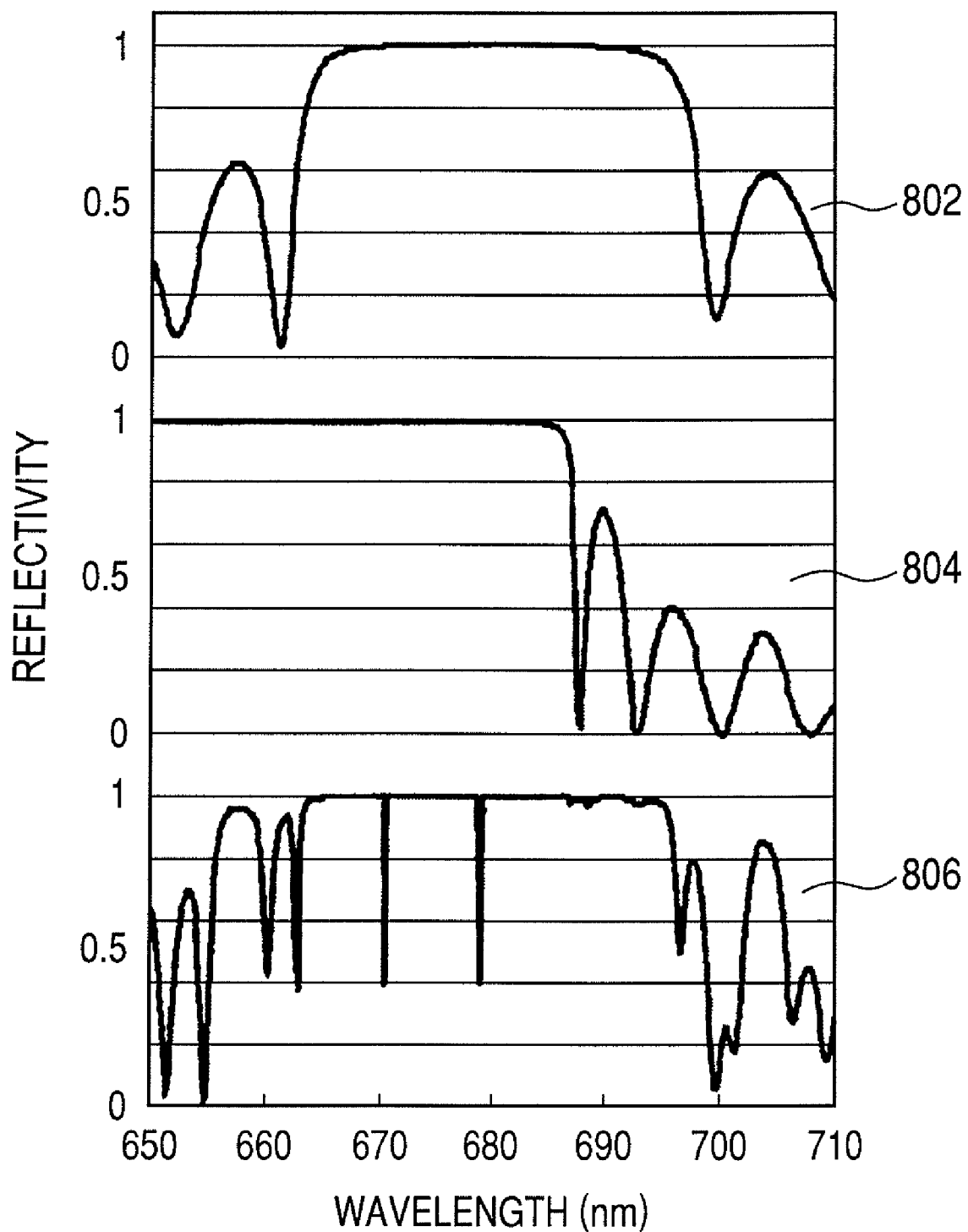
FIG. 7 is a schematic illustration of the reflection spectrum of the upper distributed Bragg reflector, that of the lower distributed Bragg reflector and that of the entire layer structure of the surface emitting laser of the second embodiment.

As illustrated in FIG. 7, the reflectivity stop band of the reflection spectrum 804 of the lower distributed Bragg reflector is shifted to the short wavelength side if compared with that of the reflection spectrum of the distributed Bragg reflector of a conventional surface-emitting laser according to the aim of the design.

As a result, while the reflectivity in the desired resonant mode (at 680 nm) of the lower distributed Bragg reflector is not less than 99%, the reflectivity in any of the longitudinal modes found at the long wavelength side relative to it (at longer wavelengths than about 690 nm) is remarkably lower than 99%.

Additionally, the center wavelength in the reflectivity stop band of the reflection spectrum 802 of the upper distributed Bragg reflector is made to agree with the resonance wavelength (680 nm) according to the aim of the design. Therefore, the reflectivity in the desired resonant mode (at 680 nm) is not less than 99%.

While the reflectivity is not less than 99% in the longitudinal mode (near 670 nm) that is found at the short wavelength side, the n-type $Al_{0.35}Ga_{0.65}As$ layer 724 that is a spacer layer in the first cavity section 704 produces band-to-band absorption at shorter wavelengths than about 670 nm.

The internal loss is made sufficiently large enough in this mode by the presence of this absorption layer to suppress any longitudinal mode oscillation at the short wavelength side.

It is sufficient for an absorption layer to produce an absorption that can suppress any longitudinal mode oscillation in any mode other than the desired resonant mode. For example, in view of the fact that the realistic thickness of an absorption layer that can be introduced into an device is about 1 to 10 times of the thickness of the active layer, an absorption material having an absorption coefficient not lower than the level of the gain (500 cm$^{-1}$ to 1,000 cm$^{-1}$) of the active layer that is produced in oscillation is preferably used. More specifically, band-to-band absorption or free carrier absorption is applicable for the purpose of the present invention.

In the case of band-to-band absorption, as a semiconductor is irradiated with light having a wavelength that corresponds to the energy level not lower than the band gap thereof, light is absorbed by the semiconductor. Therefore, any oscillation in longitudinal modes at the short wavelength side can suitably be suppressed by using a material that absorbs light of a wavelength shorter than the oscillation wavelength (light showing an energy level higher than the light of the oscillation wavelength) but does not absorb light at the oscillation wavelength for an absorption layer (e.g., the spacer layer in the cavity).

AlGaAs having an Al composition ratio of not less than 35% may be used for an absorption layer when it is desired to allow a surface-emitting laser to oscillate in a red region (e.g., at 680 nm) and suppress any oscillation in longitudinal modes at the short wavelength side.

AlGaAs having an Al composition ratio of not less than 15% may be used for an absorption layer when it is desired to allow a surface-emitting laser to oscillate in an infrared region (e.g., at 780 nm) and suppress any oscillation in longitudinal modes at the short wavelength side.

While a single layer film is selected for an absorption layer in the above description, a multilayer structure such as a quantum well structure may be selected if no absorption takes place at a desired resonance wavelength but absorption takes place at a resonance wavelength at the short wavelength side relative to it.

A surface-emitting laser is produced and the devices thereof are formed by using a wafer as described above as in the first embodiment.

A surface-emitting laser can be made to operate in a single longitudinal mode by properly applying the present invention. Such a surface-emitting laser can find applications in apparatus that require beam spot stability.

Third Embodiment

The third embodiment is an optical apparatus formed by applying a surface-emitting laser according to the present invention, the configuration of which will be described below.

More specifically, an image-forming apparatus formed by using an array of red surface-emitting lasers according to the present invention will be described as an optical apparatus.

Figure 8A:
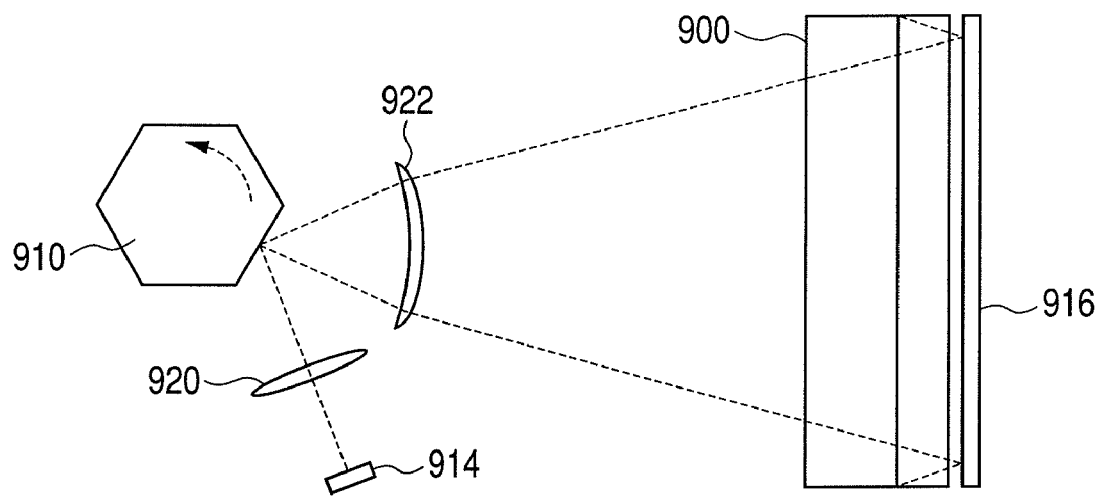
FIGS. 8A and 8B are schematic illustrations of the image forming apparatus of a third embodiment.
Figure 8B:
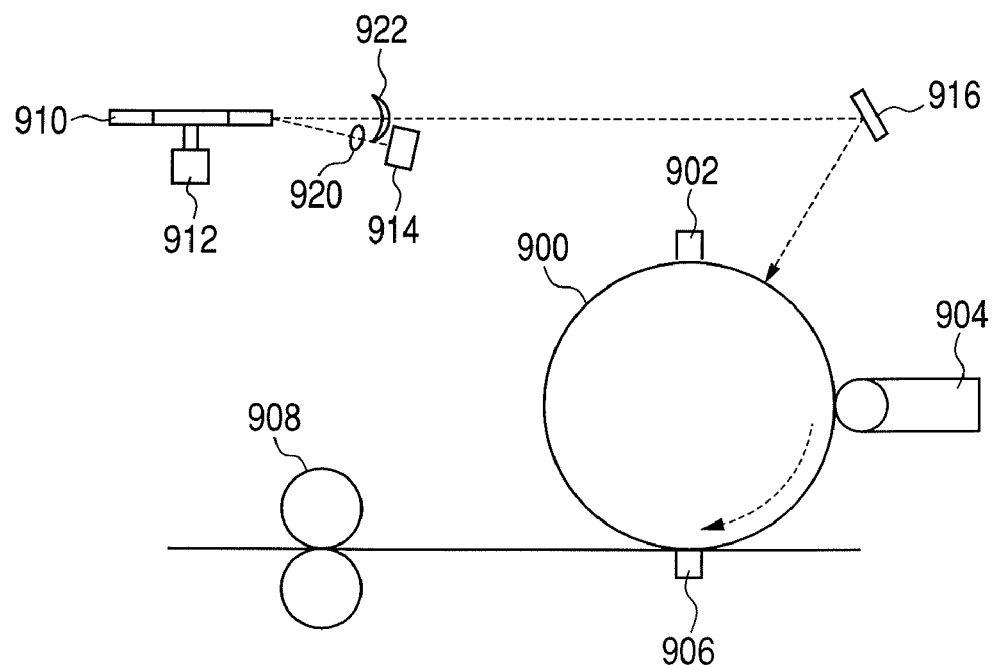

FIGS. 8A and 8B schematically illustrate an electrophotographic recording type image forming apparatus where a red surface-emitting laser array of this embodiment is installed.

FIG. 8A is a schematic plan view of the image forming apparatus and FIG. 8B is a schematic lateral view of the apparatus.

FIGS. 8A and 8B illustrate a photosensitive member 900, an electrostatic charger 902, a developer 904, a transfer charger 906, a fixer 908, a rotary polygon mirror 910 and a motor 912 as well as a red surface-emitting laser array 914, a reflector 916, a collimator lens 920 and a f-θ lens 922.

The image forming apparatus of this embodiment is designed to form an image by causing light emitted from a light source that is formed by applying surface-emitting lasers according to the present invention to strike the surface of a photosensitive member.

More specifically, the motor 912 illustrated in FIGS. 8A and 8B is designed to drive the rotary polygon mirror 910 to rotate.

The rotary polygon mirror 910 of this embodiment has six reflection planes. The reference symbol 914 denotes a red surface-emitting laser array that operates as recording light source.

The red surface-emitting laser array 914 is turned on and off by a laser driver (not illustrated) according to an image signal and the laser beams that are modulated in this way are irradiated from the red surface-emitting laser array 914 onto the rotary polygon mirror 910 by way of the collimator lens 920.

The rotary polygon mirror 910 is driven to rotate in the sense indicated by an arrow in FIG. 8A and the laser beams output from the red surface-emitting laser array 914 are reflected by the rotary polygon mirror 910 as deflected beams that continuously change the emission angle by rotation of the reflection planes thereof.

The reflected beams are corrected for distortions by the f-θ lens 922 and irradiated onto the photosensitive member 900 by way of the reflector 916 to scan the photosensitive member 900 in the main scanning direction. Then, an image is formed for a plurality of lines running in the main scanning direction that correspond to the red surface-emitting laser array 914 by the beams reflected by a plane of the rotary polygon mirror 910.

A 4×8 red surface-emitting laser array 914 is employed in this embodiment so that an image for four lines is formed at a time.

The photosensitive drum 900 is electrically charged by the electrostatic charger 902 in advance and exposed to light as the laser beams scan it to form an electrostatic latent image.

The photosensitive member 900 is driven to rotate in the sense indicated by an arrow in FIG. 8B and the formed electrostatic latent image is developed by the developer 904. Then, the developed visible image is transferred onto a sheet of transfer paper (not illustrated) by the transfer charger 906.

The sheet of transfer paper onto which a visible image is transferred is then conveyed to the fixer 908 and then discharged from the apparatus after a fixation process at the fixer 908.

While a 4×8 red surface-emitting laser is employed in this embodiment, the present invention is by no means limited thereto and any m×n red surface-emitting laser array (m and n: natural number) may be used for the purpose of the present invention.

As described above, an image forming apparatus adapted to high speed and high definition printing can be realized by applying a red surface-emitting laser array of this embodiment to an electrophotographic recording type image forming apparatus.

While an optical apparatus according to the present invention is described above in terms of an image forming apparatus, the present invention is by no means limited thereto. For example, a projection display can be realized by using a light source formed by using a surface-emitting laser according to the present invention, causing a laser beam emitted from the light source to strike the surface of an image display member to display an image.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-305862, filed Nov. 27, 2007, which is hereby incorporated by reference herein in its entirety.

What is claimed is:

1. A surface-emitting laser comprising an active layer between a first distributed Bragg reflector and a second distributed Bragg reflector, wherein
the first distributed Bragg reflector is formed so as to have a resonant mode and a first longitudinal mode different from the resonant mode as included in a first reflectivity stop band of the first distributed Bragg reflector, and so as to have a second longitudinal mode as excluded from the first reflectivity stop band;
the second distributed Bragg reflector is formed so as to have the resonant mode as included in a second reflectivity stop band of the second distributed Bragg reflector, the second reflectivity stop band having a different center wavelength from that of the first reflectivity stop band;
the resonant mode, the first longitudinal mode, and the second longitudinal mode have different wavelengths from one another; and
lasing oscillation is suppressed in the first longitudinal mode and in the second longitudinal mode.

2. The surface-emitting laser according to claim 1, wherein the second distributed Bragg reflector is formed so as to have the second longitudinal mode as included in the second reflectivity stop band and the first longitudinal mode as excluded from the second reflectivity stop band.

3. The surface-emitting laser according to claim 1, further comprising a spacer layer between the first distributed Bragg reflector and the second distributed Bragg reflector, the spacer layer being adapted to absorb light in the first longitudinal mode.

4. The surface-emitting laser according to claim 3, wherein the wavelength of the first longitudinal mode is shorter than the wavelength of the resonant mode.

5. The surface-emitting laser according to claim 1, wherein the first and second reflectivity bands have a reflectivity not less than 99%.

6. The surface-emitting laser according to claim 1, wherein
the first distributed Bragg reflector is a lower distributed Bragg reflector,
the second distributed Bragg reflector is an upper distributed Bragg reflector,
the wavelength of the first longitudinal mode is shorter than the wavelength of the resonant mode, and
the wavelength of the second longitudinal mode is longer than the wavelength of the resonant mode.

7. The surface-emitting laser according to claim 1, wherein the active layer is made of GaInP.

8. The surface-emitting laser according to claim 1, wherein the surface-emitting laser is incorporated in an optical apparatus such that light from the surface emitting laser strikes a surface of a photosensitive member or an image display member to form or display an image.

* * * * *